US005512495A

United States Patent [19]

Mei et al.

[11] Patent Number: 5,512,495
[45] Date of Patent: Apr. 30, 1996

[54] METHOD OF MANUFACTURING EXTENDED DRAIN RESURF LATERAL DMOS DEVICES

[75] Inventors: Chia-Cu P. Mei, Plano; Satwinder Malhi, Garland, both of Tex.

[73] Assignee: Texas Instruments Incorporated, Dallas, Tex.

[21] Appl. No.: 390,269

[22] Filed: Feb. 16, 1995

Related U.S. Application Data

[63] Continuation of Ser. No. 224,914, Apr. 8, 1994, abandoned.
[51] Int. Cl.$^6$ ..................... H01L 21/336; H01L 21/266
[52] U.S. Cl. ................. 437/28; 437/29; 437/30; 437/40; 437/154; 148/DIG. 126
[58] Field of Search .................. 437/29, 27, 28, 437/30, 154, 40 DM, 41 DM; 148/DIG. 126

[56] References Cited

U.S. PATENT DOCUMENTS

| | | |
|---|---|---|
| 4,586,064 | 4/1986 | Esser et al. |
| 4,984,196 | 1/1991 | Tran et al. |
| 4,987,093 | 1/1991 | Teng et al. |
| 5,013,671 | 5/1991 | Havemann. |
| 5,110,750 | 5/1992 | Yoshida ..................... 437/30 |
| 5,156,989 | 10/1992 | Williams et al. |
| 5,264,719 | 11/1993 | Beasom. |
| 5,304,827 | 4/1994 | Mahli et al. |
| 5,306,652 | 4/1994 | Kwon et al. ................. 437/41 |
| 5,322,804 | 6/1994 | Beasom. |
| 5,328,859 | 7/1994 | Vo et al. |
| 5,346,835 | 9/1994 | Mahli et al. ................. 437/29 |

FOREIGN PATENT DOCUMENTS

| | | | |
|---|---|---|---|
| 62-37943 | 2/1987 | Japan | 437/30 |
| 62-131538 | 6/1987 | Japan | 437/30 |
| 2-226743 | 9/1990 | Japan | 437/30 |

OTHER PUBLICATIONS

C. A. T. Salama, "Lateral Silcon Devices and High Voltage Integrated Circuits," May 1993.
Zahr Parpia and C. A. T. Salama, "Optimization of RESURF LDMOS Transistors: An Analytical Approach," *IEEE Transactions on Electron Devices*, vol. 37, No. 3, Mar. 1990.
Taylor Efland et al, "An Optimized RESURF LDMOS Power Device Module Compatible with Advanced Logic Processes," *Texas Instrumetns Incorporated*, Dec. 1992.
Professor B. Jayant Baliga, "Smart Power Technolgy: An Elephantine Opportunity" (Invited Plenary Session Paper), *IEDM 90-3, 1990 IEEE*, pp. 1.1.1–1.1.4.
Habekotte et al., "A Coplanar CMOS Power Switch," *IEEE J. Solid–State Circuits*, Vol. SC–16, pp. 212–226, Jun. 1981.
J. A. Appels and H. JM. J. Vaes, High Voltage Thin Layer Devices (Resurf Devices), *IEDM Proceedings 1979*, pp. 238–241.
Webster's II Dictionary, p. 1011.
S. Wolf & R. N. Tauber "Silicon Processing for the VLSI Era" lattice Press, vol. I, 1986, pp. 228–230.
S. Wolf, "Silicon Processing for the VLSI Era", vol. II, Lattice Press, 1990, p. 423.

*Primary Examiner*—Tom Thomas
*Assistant Examiner*—Leon Radomsky
*Attorney, Agent, or Firm*—Gerald E. Laws; Robby T. Holland; Wade James Brady, III

[57] ABSTRACT

A high voltage PMOS transistor 7 has improved on resistance by adjusting impurity concentration in a lightly doped drift region rim 48 to compensate for impurity segregation which occurs during the growth phase of a thick field oxide 43. During fabrication of high voltage PMOS device 7, a shallow vertical junction 230 formed by impurity segregation into field oxide 43. Implanting an HV drift region p-tank rim adjustment 220 and annealing it forms a lateral junction 250 and isolates the shallow junction 230 under field oxide 43. Thereby, the on-resistance of high voltage PMOS transistor 7 is minimized.

5 Claims, 6 Drawing Sheets

METHOD OF MANUFACTURING EXTENDED DRAIN RESURF LATERAL DMOS DEVICES

This application is a Continuation of patent application Ser. No. 08/224,914, filed Apr. 8, 1994 abandoned.

FIELD OF THE INVENTION

This invention is in the field of semiconductor integrated circuits and relates primarily to high voltage CMOS devices.

BACKGROUND OF THE INVENTION

Integrated circuits with combined control and driver functions are often referred to as smart power devices. Smart power devices combine high intelligence with low power dissipation. They typically have power Metal Oxide Semiconductor, MOS, Field Effect Transistors, FETs, in their output stages designed to operate at higher voltages, such as 15–80 volts as opposed to the normal Complementary Metal Oxide Semiconductor, CMOS, logic voltage of typically 5 volts or less, and logic devices incorporated on the same integrated circuit so that both a driver function and a controller function are provided in a single chip. Many applications exist for smart power devices such as Liquid Crystal Display, LCD, displays, electro/mechanical devices, automobile electronic devices, projection TV, and even High Definition, HDTV.

A technique for fabricating high voltage, HV, MOS devices is described in an article entitled "High Voltage Thin Layer Devices (RESURF Devices)," IEDM Proceedings, 1979, pp 238–241. This technique uses a shallow lightly doped region between the drain and channel regions of the device. This shallow lightly doped region is referred to as a drift region because of the low amount of current carriers (carriers being electrons or "holes") that are available due to the low level of impurity doping and the device is known as a Reduced Surface Field, RESURF, device.

RESURF techniques are utilized in manufacturing high voltage N-channel Lateral Double Diffused MOS, HV NMOS, devices and high voltage P-channel LDMOS, HV PMOS devices. However, problems exist in manufacturing smart power devices containing such RESURF HV PMOS devices. Typically, complicated charge pumping high voltage circuitry techniques are used for HV PMOS devices. Typically the on-resistance of the HV PMOS device is relatively high. For example, an HV PMOS device described in an article entitled "A Coplanar CMOS Power Switch," in IEEE J. Solid-State Circuits, vol SC-16, pp 212–226, June 1981, uses a lightly doped pinched resistance as the drift region.

It is accordingly an object of the invention to provide a simple method to manufacture smart power devices which contain high voltage PMOS devices that have low on resistance.

Other objects and advantages will be apparent to those of ordinary skill in the art having reference to the following figures and specification.

SUMMARY OF THE INVENTION

In accordance with the present invention, a boron segregation in a lightly doped RESURF region of a high voltage PMOS device is corrected by an implant at the edge of the field oxide of the HV PMOS device. This implant restores the boron concentration in the RESURF region and cuts off or isolates the shallow vertical junction that forms during the growth of the thick oxide, resulting in significantly improved operational characteristics of the HV PMOS device. The implant is accomplished very simply by adding a single additional mask step.

BRIEF DESCRIPTION OF THE DRAWINGS

FIGS. 2A–2J are cross-sectional views illustrating a preferred method of constructing an HV PMOS device similar to FIG. 1 in accordance with the present invention.

DESCRIPTION OF THE PREFERRED EMBODIMENT OF THE INVENTION

A preferred embodiment of the invention is now described. Table A contains a listing of element names and reference numbers used in the drawings and the following description, while Table B provides the function, a specific embodiment and alternate examples of various elements. Tables A and B are incorporated herein and made a part of this specification.

Figure 1:
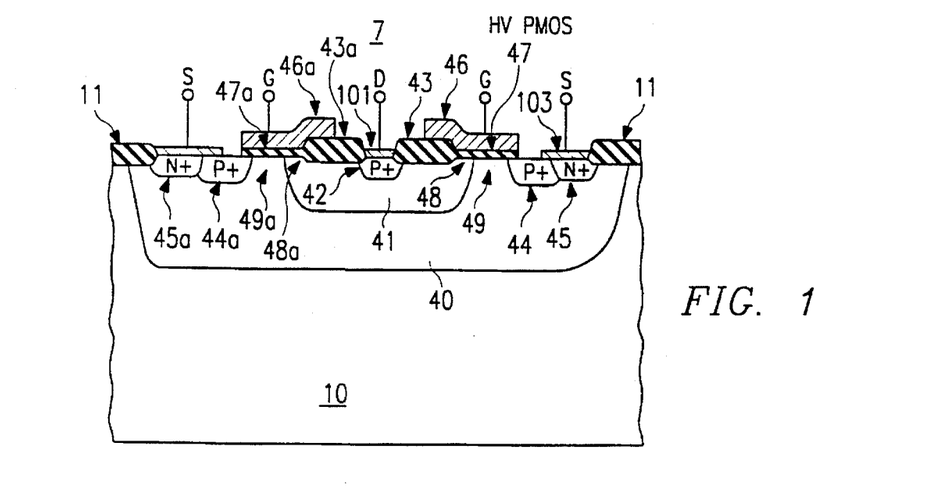
FIG. 1 is a cross-sectional view of an integrated circuit illustrating an HV PMOS device formed on in accordance with the present invention.

FIG. 1 shows a cross-sectional view of an integrated circuit formed in accordance with the invention containing a high voltage PMOS (HV PMOS) transistor 7. HV PMOS device 7 is formed in a well 40 which isolates HV PMOS device 7 from the semiconductor substrate 10. Substrate 10 is preferably n-type silicon with a relatively high resistivity of approximately 8–12 Ohm-cm.

In FIG. 1, HV PMOS device 7 has a p-tank 41 lying within n-well 40. P-tank 41 provides a RESURF drift region. A drift region rim 48 forms the outer edge of p-tank 41 and is adjacent to and in contact with channel region 49. An HV drain 42 is formed within p-tank 41. An HV source 44 is formed within n-well 40 and is separated from p-tank 41 by channel region 49. An HV field oxide 43 overlies a portion of the drift region p-tank 41. A gate oxide 47 overlies the channel region 49 and the drift region rim 48, and connects to HV field oxide 43. An HV n-well contact 45 is formed within n-well 40. An HV gate electrode 46 overlays gate oxide 47 and field oxide 43. FIG. 1 also shows an optional mirror image gate and source consisting of HV source 44a formed within n-well 40 and separated from drain 42 by channel region 49a, HV gate oxide 47a overlaying channel region 49a and connecting with HV field oxide 43a, HV n-well contact 45a formed within n-well 40, and HV gate electrode 46a overlaying gate oxide 47a and field oxide 43a.

Still referring to FIG. 1, p-tank 41 can be formed with lightly doped boron, for example. It has been found that when thick field oxide 43 is grown on silicon containing lightly doped boron regions, such as p-tank 41, boron may be segregated out of the silicon at the oxide growth boundary, such as drift region rim 48, and a region is formed at the growth boundary that has inferior semiconductor properties; this effect makes it difficult to form P-channel LDMOS high voltage RESURF devices with good operational characteristics. However, in accordance with the present invention, these deficiencies are advantageously minimized, as will be described later. Using only one additional mask step in a standard CMOS fabrication process, an implant in drift region rim 48 at the edge of field oxide 43 restores the boron concentration in p-tank rim 48 and cuts off or isolates a shallow vertical junction that may be formed during the growth of thick oxide 43.

Referring now to FIGS. 2A–2J, a preferred process for forming a transistor similar to FIG. 1 is described. For simplicity, the following figures complete HV PMOS device 7 of FIG. 1 as a single-sided device as opposed to the double-sided device shown in FIG. 1.

Figure 2A:
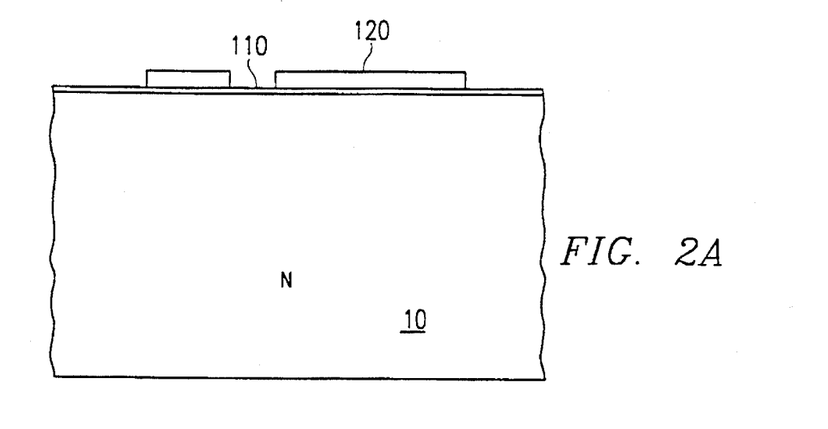

FIG. 2A shows n type substrate 10 on which a layer of 1st oxide 110 is grown with a nitride layer 120 deposited on top. Nitride layer 120 is then masked and etched.

Figure 2B:
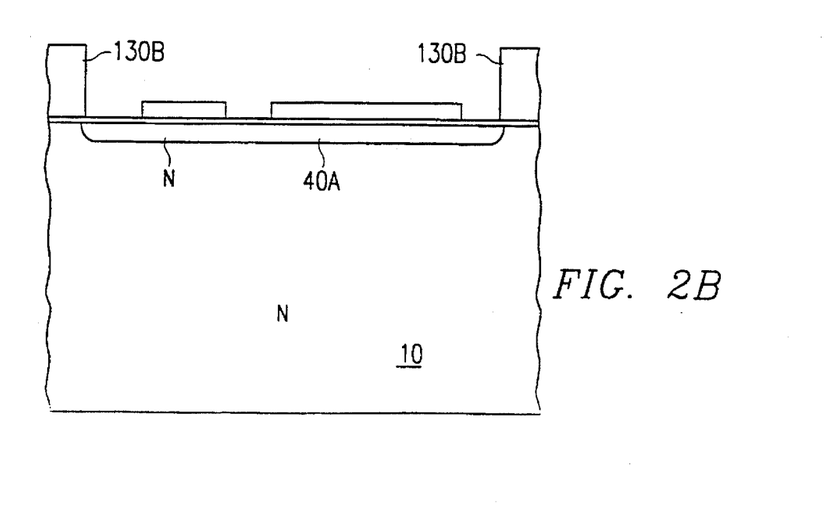

FIG. 2B shows n-type dopant 40A after implantation. N-type dopant 40A can be arsenic or phosphorous, for example. Photoresist 130B blocks the dopant 40A from undesired insertion. The implant occurs through oxide layer 110 and nitride layer 120. Dopant 40A is used to form tank 40.

FIG. 2C shows the result of a diffusion step which causes n-type dopant 40A to form HV n-well 40. The diffusion drives the dopants into substrate 10 to a depth of approximately 8 um. An n-type impurity concentration of approximately $1.5e16/cm^3$ is sufficient for n-well 40.

FIG. 2D shows p-type implant 41A after being implanted. P-type dopant can be boron, for example. Photoresist 130D blocks the dopant 41A from undesired insertion. Dopant 41A is implanted within n-well 40.

FIG. 2E shows the result of a diffusion step that forms HV drift region p-tank 41. The drift region depth is limited to about 1–2 um so that when a depletion region is formed in drift region 41 in response to the application of a source to drain voltage ($V_{ds}$), the resulting field will impinge on the surface of the device and thereby reduce the voltage gradient on the surface, according to the well known operation of a RESURF device. A p-type impurity concentration of approximately $8.0e16/cm^3$ is sufficient for drift region p-tank 41.

Figure 2F:
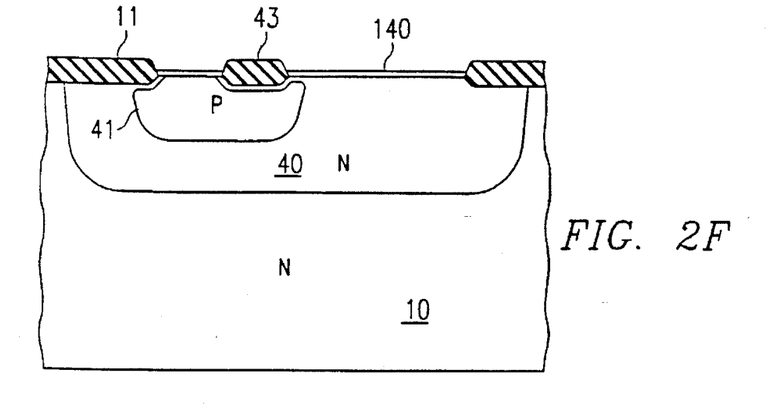

FIG. 2F shows field oxide 11, and HV PMOS field oxide 43 that are grown thermally on areas which are not covered with nitride 120. Boron may segregate out of p-tank 41 in the area adjacent to field oxide 43 during field oxide 43 growth. After oxide growth, nitride 120 is removed. Dummy oxide 140 is then grown over the exposed areas.

Figure 2G:
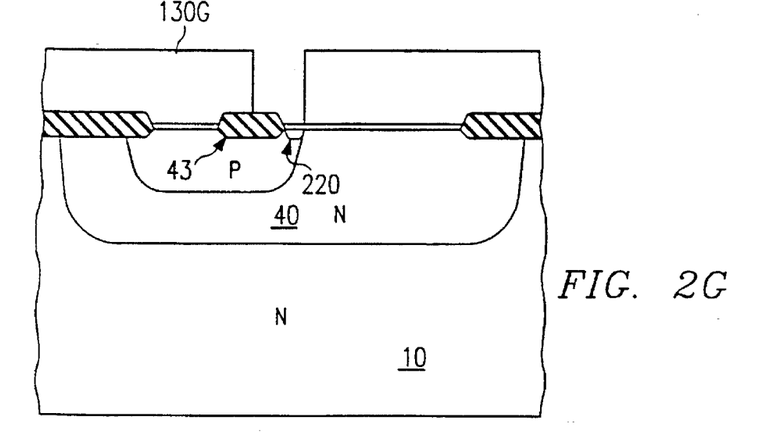

FIG. 2G shows a p-type dopant 220 after implantation. P-type dopant 220 may be boron, for example. A photoresist 130G blocks the dopant 220 from undesired insertion. According to the invention, P-type dopant 220 advantageously replaces boron that may be undesirably lost during the formation of field oxide 43. P-type dopant 220 may be annealed at this point, or preferably dopant 220 will be annealed in conjunction with a later diffusion, shown in FIG. 2J for example.

Figure 2H:
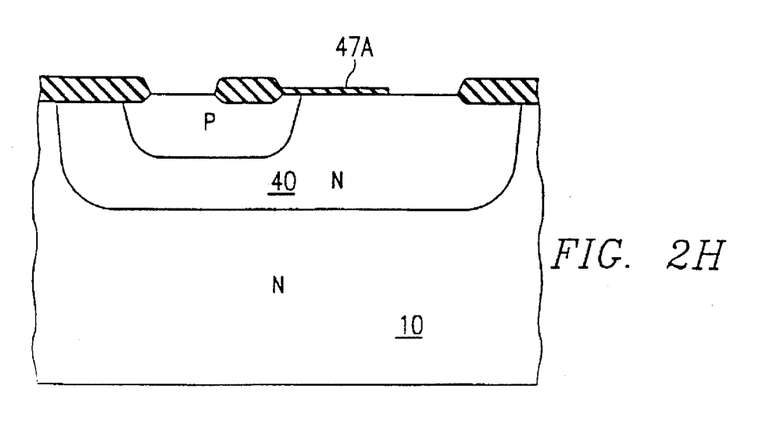

FIG. 2H shows a partial HV gate oxide 47A which is formed by depositing oxide over the integrated circuit, patterning, and etching the oxide layer. The thickness of oxide 47A is selected so that the oxide added in the following step will combine to create the target thickness for an HV gate oxide 47, shown in FIG. 2J. Partial HV gate oxide 47A may be 800 Å thick, for example.

Figure 2I:
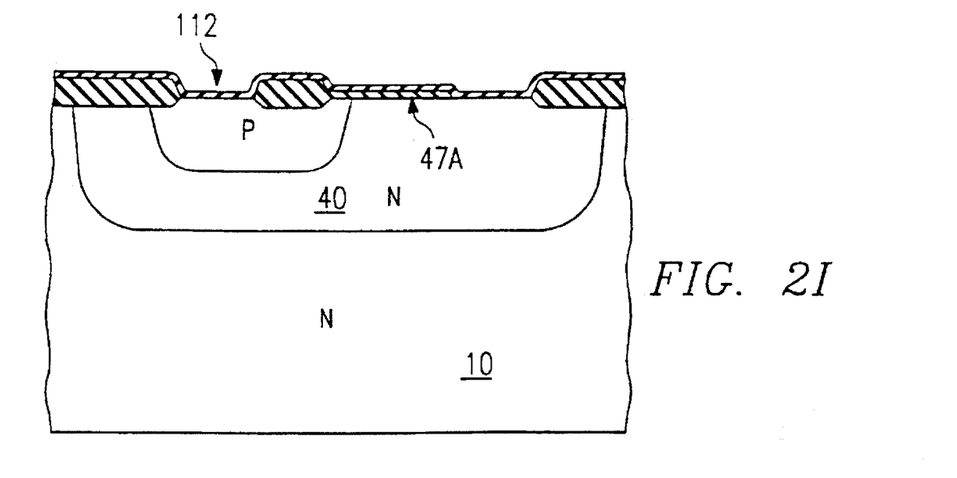

In FIG. 2I, a thin oxide layer 112 is deposited over the integrated circuit. Oxide layer 112 overlies partial gate oxide 47A. Oxide layer 112 may be approximately 350 Å thick, for example. Oxide layer 112 is then patterned and etched, forming HV gate oxide 47 shown in FIG. 2J.

Figure 2J:
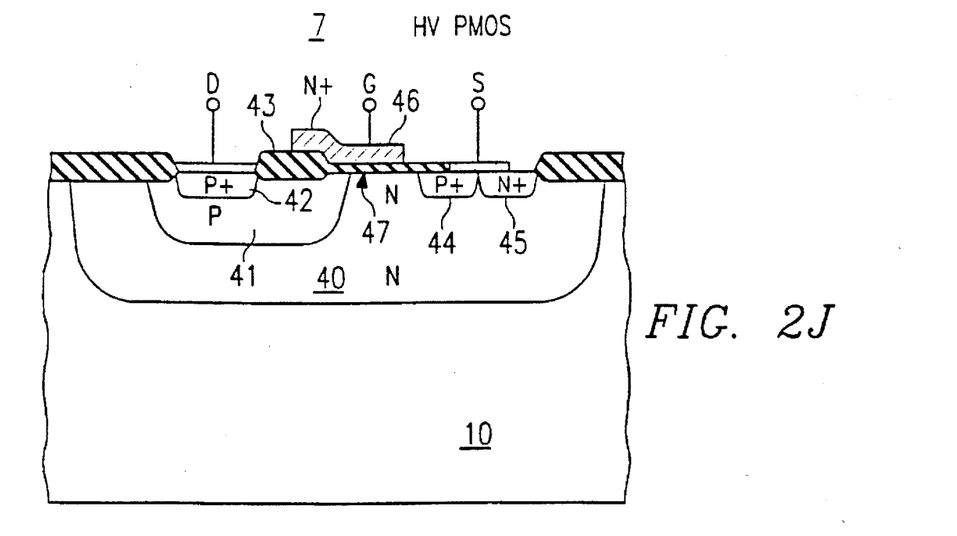

In FIG. 2J, polysilicon has been deposited and etched to form HV gate electrode 46. HV p+ drain 42 and HV p+ source 44 are implanted. HV n+ n-well contact 45 is implanted. All of the drain and source elements (42, 44, and 45) can then be diffused in a single diffusion step to approximately the same depth to yield the device of FIG. 1. Well known steps can then be followed to complete the integrated circuit.

Figure 3A:
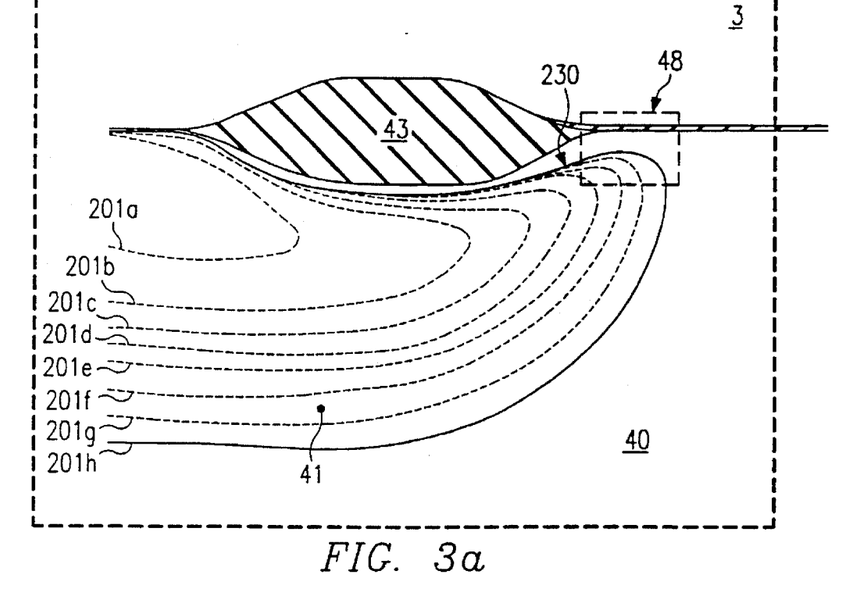
FIG. 3A is a cross-sectional view of the HV PMOS device of FIG. 1 showing impurity concentration gradient lines in the HV drift region tank after field oxide growth.
Figure 3B:
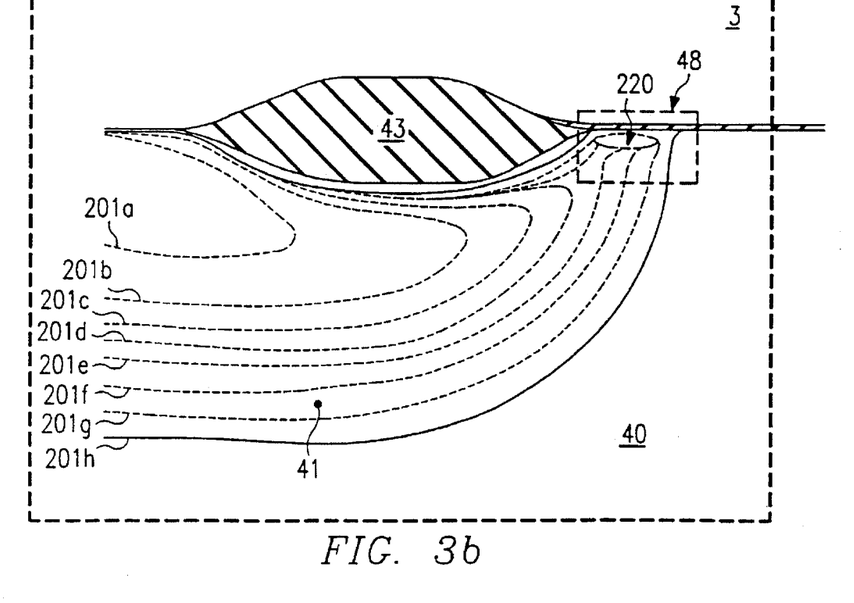
FIG. 3B is a cross-sectional view of the HV PMOS device of FIG. 1 showing impurity concentration gradient lines in the HV drift region tank after implanting an HV drift region tank rim adjustment.
Figure 3C:
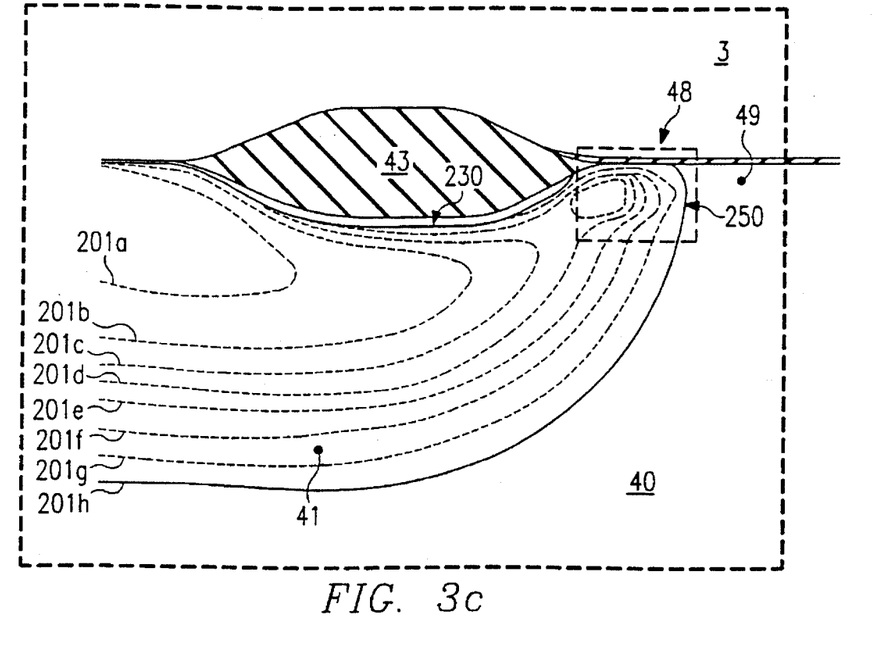
FIG. 3C is a sectional view of the HV PMOS device of FIG. 1 showing impurity concentration gradient lines in the HV drift region tank after annealing the HV drift region tank rim adjustment.

FIGS. 3A–3C illustrate benefits of the invention in more detail. Referring to FIG. 3A, the effect of boron impurity segregation during oxide growth is shown. Impurity concentration gradient lines 201a–201h show the impurity concentration (i.e., boron) in the lightly doped drift region 41 after the oxide 43 growth, as shown in FIG. 2F, is completed. Impurity concentration line 201a represents the higher concentration area, which is about $1.5e16/cm^3$. Impurity concentration line 201h represents the lower concentration boundary of the drift region 41. In drift region tank rim area 48, the impurity concentration has segregated out of the drift region tank 41, leaving a shallow vertical junction 230 under the field oxide 43. Shallow vertical junction 230 will degrade the performance of PMOS device 7.

The invention minimizes potential device performance degradation caused by the boron segregation. Referring to FIG. 3B and FIG. 2G, HV drift region tank rim adjustment 220 is shown. An additional implant of the same impurity used for the drift region tank 41 (i.e., boron) re-establishes the impurity concentration in drift region tank rim 48 and eliminates the shallow vertical junction 230.

Referring to FIG. 3c, annealing the drift region tank rim adjustment 220 smooths the impurity gradient as shown by impurity gradient lines 201a–201h and forms a preferred lateral junction 250. A very small isolated portion of the shallow vertical junction 230 may remain under field oxide 43, but this has little effect on the performance of PMOS device 7. The HV drift region p-tank rim 48 adjacent to the channel region 49 now advantageously does not have a deficiency of impurity concentration which would undesirably increase the on resistance, $R_{ds(on)}$, of HV PMOS device 7.

The invention is not limited to masked ion implantation onto field oxide to cutoff or isolate the shallow vertical junction which formed during thick field oxidation, as was described in the preferred embodiment. It can also be advantageously applied to many forms of vertical junction dopant compensation techniques which serve the purpose of counter doping for isolation in order to form a lateral junction.

This invention can be advantageously applied to many forms of high voltage PMOS devices used in smart power devices.

The present invention may be embodied using various topological shapes, such as a square drift region 41 or a rounded drift region 41, for example.

Another advantage of the current invention is that a simple process that is adaptable to most CMOS fabrication processes allows the high voltage PMOS devices to be optimized independently of other types of devices on the integrated circuit so that $R_{ds(on)}$ of the high voltage PMOS device is minimized.

While the invention has been described with respect to illustrative embodiments, this description is not intended to be construed in a limiting sense. Various other embodiments of the invention will be apparent to persons skilled in the art upon reference to this description. For example, an alternate embodiment may use either N or P type substrate 10 since the device is isolated by well 40 in the preferred embodiment. An alternate embodiment may use an epi layer under a lightly doped RESURF region or other configurations instead of well 40. It is therefore contemplated that the appended claims will cover any such modifications of the embodiments as fall within the true scope and spirit of the invention.

TABLE A

| Element | Element Name |
|---|---|
| 10 | semiconductive substrate |
| 40 | HV n-well |
| 41 | HV drift region (p)-tank |
| 42 | HV PMOS drain |
| 43 | HV PMOS field oxide |
| 44, 44a | HV p+ source |
| 45, 45a | HV n+ n-well contact region |
| 46, 46a | HV PMOS gate electrode |
| 47 | HV PMOS gate oxide |
| 48 | HV PMOS drift region rim |
| 49 | HV PMOS channel region |
| 101 | HV drain electrode |
| 103 | HV source electrode |
| 110 | 1st oxide |
| 120 | nitride layer |
| 130 | photoresist pattern |
| 140 | dummy oxide |
| 201A-201h | impurity concentration gradient line |
| 220 | HV drift region p-tank adjustment |
| 230 | shallow vertical junction |
| 250 | lateral junction |

What is claimed is:

1. A method for making a high voltage P-channel Metal Oxide Semiconductor, PMOS, device, comprising the steps of:

forming a lightly doped high voltage drift region p-tank having a p-type impurity concentration, said drift region being adjacent to an n-type channel region;

forming a vertical PN junction in a portion of the drift region p-tank which is adjacent to said n-type channel region by impurity segregation resulting from the growth of a high voltage field oxide; and forming a horizontal PN junction between said drift region and said channel region by implanting a drift region rim adjustment in a portion of the drift region adjacent to the channel region and under a portion of the field oxide such that said vertical PN junction is cutoff and isolated from said channel region.

2. The method of claim 1, wherein;

the step of forming the drift region p-tank limits the drift region p-tank to a depth of less than 5 um.

3. The method of claim 1, wherein:

the step of forming the drift region p-tank uses boron as the impurity; and the step of forming a horizontal PN junction uses boron as the impurity.

4. The method of claim 1, wherein:

the step of forming the high voltage drift region p-tank comprises implanting the drift region p-tank with an

TABLE B

| Element | Function | Specific embodiment<br>HVPMOS related breakdown = 30 V. | Alternate examples<br>HV breakdown =<br>approx 15–80 v. |
|---|---|---|---|
| 10 | foundation for active elements | 8–12 ohm-cm (n-) Si | 8–12 onm-cm (p-) Si |
| 40 | localized semiconductive substrate well | formed (n), approx 1.5e16/cm$^3$ approx 8 um deep | approx 1.0e15–5.0 e16/cm$^3$ approx 4.0–10 um deep |
| 41 | drain depletion region to reduce the surface field | formed boron (p), approx 8.0e16/cm$^3$, approx 1.1 um deep | approx 0.1–3.0 e17/cm$^3$ approx 1.0–2.5 um |
| 42 | highly conductive drain contact region | formed (p+), approx 1.0e19/cm$^3$, approx 0.5 um deep | |
| 43 | insulate gate from drain and drift region | thermal Si oxide, approx 9300 Å | |
| 44 | source region | formed (p+), approx 1.0e19/cm$^3$, approx 0.5 um deep | |
| 45 | highly conductive tank contact region | formed (n+), approx 1.0e19/cm$^3$, approx 0.5 um deep | |
| 46 | gate electrode | poly Si | metal, such as Al, Cu |
| 47 | insulate gate from conductive regions | deposited Si oxide, approx 1000 Å | |
| 48 | rim of drift region tank 41 | | |
| 49 | semiconductive region | formed (n) | |
| 101 | drain electrode | poly Si | a) metal, such as Al, Cu<br>b) refractory metal silicide |
| 103 | source electrode | poly Si | a) metal, such as Al, Cu<br>b) refractory metal silicide |
| 110 | etch stop for nitride, protect crystal surface | thermal oxide, approx 400 Å | |
| 120 | mask for field oxide | deposited Si$_3$N$_4$, approx 1200 Å | |
| 130 | mask for implants | | |
| 140 | protect crystal surface | thermal oxide, approx 400 Å | |
| 201a-201h | impurity concentration lines | approx 1.0e16/cm$^3$ per line | |
| 220 | replace lost boron impurity concentration | formed boron, approx 1.0e13/cm$^3$ | approx 0.5–1.5e13/cm$^3$ |
| 230 | undesireable side effect of thermal oxide growth | boron segregation | |
| 250 | lateral junction improves device performance | junction between the drift region and the channel region | | impurity concentration of greater than about $1e15/cm^3$ of boron;

the step of forming a vertical PN junction comprises growing the field oxide to a thickness greater than approximately 0.6 um; and the step of forming a horizontal PN junction comprises implanting the high voltage drift region p-tank region adjacent to the channel region and under a portion of the field oxide with an impurity concentration in the range of approximately $0.5-1.5e14/cm^3$.

5. The method of claim 1, wherein:

the step of forming a horizontal PN junction comprises implanting the drift region rim adjustment in a portion of the drift region adjacent to the channel region and under a portion of the field oxide with an impurity concentration of less than an average impurity concentration of the lightly doped drift region.

* * * * *